(12) United States Patent
Bergbauer et al.

(10) Patent No.: US 8,823,034 B2
(45) Date of Patent: Sep. 2, 2014

(54) OPTOELECTRIC SEMICONDUCTOR CHIP

(75) Inventors: Werner Bergbauer, Windberg (DE);
Patrick Rode, Regensburg (DE);
Martin Straβburg, Donaustauf (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/825,842

(22) PCT Filed: Sep. 26, 2011

(86) PCT No.: PCT/EP2011/066687
§ 371 (c)(1),
(2), (4) Date: May 7, 2013

(87) PCT Pub. No.: WO2012/052257
PCT Pub. Date: Apr. 26, 2012

(65) Prior Publication Data
US 2013/0221369 A1      Aug. 29, 2013

(30) Foreign Application Priority Data
Sep. 28, 2010   (DE) .......................... 10 2010 046 792

(51) Int. Cl.
*H01L 33/00* (2010.01)
(52) U.S. Cl.
USPC .................. 257/98; 257/89; 257/99; 257/434
(58) Field of Classification Search
CPC .......... H01L 33/50; H01L 33/58; H01L 33/60
USPC ............... 257/12–13, 81, 84, 87–89, 98–100, 257/347–348, 433–434; 313/112, 501, 503, 313/506–507
See application file for complete search history.

(56) References Cited

U.S. PATENT DOCUMENTS

| | | | |
|---|---|---|---|
| 7,078,318 B2 | 7/2006 | Jürgensen et al. | |
| 2008/0149956 A1 | 6/2008 | Mueller-Mach et al. | |
| 2009/0101923 A1 | 4/2009 | Choi et al. | |
| 2010/0001289 A1 | 1/2010 | Frayssinet et al. | |
| 2011/0260205 A1* | 10/2011 | Moosburger et al. | 257/99 |
| 2011/0272728 A1* | 11/2011 | Rode et al. | 257/99 |

FOREIGN PATENT DOCUMENTS

| | | |
|---|---|---|
| DE | 10 2007 022 947 A1 | 10/2008 |
| DE | 10 2008 011 848 A1 | 9/2009 |
| DE | 10 2008 032 318 A1 | 10/2009 |
| DE | 10 2008 022 942 A1 | 11/2009 |

(Continued)

OTHER PUBLICATIONS

Taiwanese Examination Report dated Jan. 17, 2014 for corresponding Taiwanese Patent Application No. 100134916.

(Continued)

*Primary Examiner* — Dung A. Le
(74) *Attorney, Agent, or Firm* — DLA Piper LLP (US)

(57) ABSTRACT

An optoelectronic semiconductor chip includes a semiconductor layer stack consisting of a nitride compound semiconductor material on a carrier substrate, wherein the carrier substrate includes a surface containing silicon. The semiconductor layer stack includes a recess extending from a back of the semiconductor layer stack through an active layer to a layer of a first conductivity type. The layer of the first conductivity type connects electrically to a first electrical connection layer which covers at least a portion of the back through the recess. The layer of a second conductivity type connects electrically to a second electrical connection layer arranged at the back.

5 Claims, 3 Drawing Sheets

(56) References Cited

FOREIGN PATENT DOCUMENTS

| | | |
|---|---|---|
| DE | 10 2008 056 175 A1 | 5/2010 |
| DE | 10 2009 030 243 A1 | 5/2010 |
| DE | 10 2009 047 881 A1 | 4/2011 |
| DE | 10 2010 035 489 A1 | 3/2012 |
| EP | 1 577 958 A1 | 9/2005 |
| EP | 2 357 679 A2 | 8/2011 |
| GB | 701069 | 12/1953 |
| GB | 702560 | 1/1954 |
| WO | 03/003421 A2 | 1/2003 |
| WO | 2009/135457 A1 | 11/2009 |
| WO | 2010/056083 A2 | 5/2010 |

OTHER PUBLICATIONS

Akihiko Kikuchi et al., "InGaN/GaN Multiple Quantum Disk Nanocolumn Light-Emitting Diodes Grown on (111) Si Substrate," Japanese Journal of Applied Physics, vol. 43, No. 12A, 2004, pp. L1524-L1526.

Fang Qian et al., "Gallium Nitride-Based Nanowire Radial Heterostructures for Nanophotonics," Nano Letters, vol. 4, No. 10, 2004, pp. 1975-1979.

Z. Bougrioua et al., "Growth of freestanding GaN using pillar-epitaxial lateral overgrowth from GaN nanocolumns," Journal of Crystal Growth, vol. 309, 2007, pp. 113-120.

Hon-Way Lin et al., "InGaN/GaN nanorod array white light-emitting diode," Applied Physics Letters, vol. 97, 2010, pp. 073101-1-3.

\* cited by examiner

OPTOELECTRIC SEMICONDUCTOR CHIP

TECHNICAL FIELD

This disclosure relates to an optoelectronic semiconductor chip comprising a semiconductor layer stack and a carrier substrate and a method for the production thereof.

BACKGROUND

Compound semiconductor materials are of great importance for the production of, for example, light-emitting diodes (LEDs). Suitable layer sequences are grown on a substrate to produce such LEDs. The performance of such LEDs is influenced, inter alia, by the substrate material used. The substrate material may in particular exhibit significant differences with regard to coefficient of expansion and/or lattice parameters compared with the material of the layer sequence. Sapphire or silicon carbide is therefore conventionally used as the substrate material for epitaxial growth since this material has a lattice structure adapted to the lattice structure of the compound semiconductor materials. The disadvantage of these substrate materials is however inter alia their high price.

An example of a favorable substrate material frequently used in semiconductor technology is silicon. When growing in particular nitride compound semiconductor materials on, for example, silicon substrates, however, strains arise due to different lattice parameters of the materials involved which may lead to a reduction in the crystal quality of the layers grown.

It could therefore be helpful to provide a semiconductor chip which can be produced inexpensively and at the same time exhibits reduced strain within the different materials of the semiconductor chip. It could also be helpful to provide an inexpensive production method for such a semiconductor chip.

SUMMARY

We provide an optoelectronic semiconductor chip including a semiconductor layer stack consisting of a nitride compound semiconductor material on a carrier substrate, wherein the carrier substrate includes a surface containing silicon and facing the semiconductor layer stack, the semiconductor layer stack includes an active layer that generates radiation arranged between a layer of a first conductivity type and a layer of a second conductivity type, the layer of the first conductivity type is adjacent a front of the semiconductor layer stack, the semiconductor layer stack contains at least one recess extending from a back, opposite the front, of the semiconductor layer stack through the active layer to the layer of the first conductivity type, the layer of the first conductivity type electrically connects to a first electrical connection layer, which covers the back of the semiconductor layer stack at least in places, through the recess, and the layer of the second conductivity type electrically connects to a second electrical connection layer arranged at the back, a plurality of nanostructures is arranged on the front, the nanostructures are formed rod-like or are nanopyramids, nanowires or nanorods, a conversion element is arranged on the front which converts at least some of the radiation emitted by the active layer into radiation of another wavelength, and the conversion element is an InGaN layer arranged and integrated into the nanostructures.

We also provide a method of producing an optoelectronic semiconductor chip including a semiconductor layer stack consisting of a nitride compound semiconductor material on a carrier substrate, including providing a growth substrate including a surface containing silicon, epitaxially growing the semiconductor layer stack on the surface, stack including an active layer that generates radiation and arranged between a layer of a first conductivity type and a layer of a second conductivity type, the layer of the first conductivity type being adjacent a front of the semiconductor layer stack, forming at least one recess in the semiconductor layer stack, the recess extending from a back, opposite the front, of the semiconductor layer stack through the active layer to the layer of the first conductivity type, electrically connecting the layer of the first conductivity type through the recess by a first electrical connection layer, which covers the back of the semiconductor layer stack at least in places, electrically connecting the layer of the second conductivity type by a second electrical connection layer arranged at the back, applying the carrier substrate to the opposite side of the semiconductor layer stack from the growth substrate, and detaching the growth substrate, wherein a plurality of nanostructures is formed on the front, the nanostructures are formed rod-like or are nanopyramids, nanowires or nanorods, a conversion element is introduced into the nanostructures, which element converts at least some of the radiation emitted by the active layer into radiation of another wavelength, the conversion element being an InGaN layer.

We further provide an optoelectronic semiconductor chip including a semiconductor layer stack consisting of a nitride compound semiconductor material on a carrier substrate, wherein the carrier substrate includes a surface containing silicon and facing the semiconductor layer stack, the semiconductor layer stack includes an active layer that generates radiation arranged between a layer of a first conductivity type and a layer of a second conductivity type, the layer of the first conductivity type is adjacent a front of the semiconductor layer stack, the semiconductor layer stack contains at least one recess extending from a back, opposite the front, of the semiconductor layer stack through the active layer to the layer of the first conductivity type, the layer of the first conductivity type connects electrically to a first electrical connection layer which covers the back of the semiconductor layer stack at least in places, through the recess, and the layer of the second conductivity type connects electrically to a second electrical connection layer arranged at the back.

DETAILED DESCRIPTION

Figure 1:
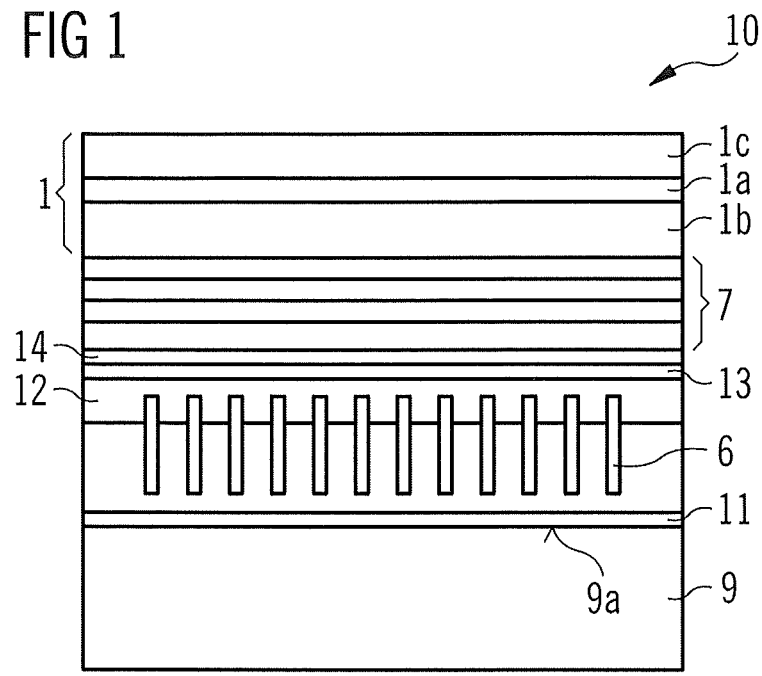
FIG. 1 shows a schematic cross-section of a semiconductor chip under production.

Our optoelectronic semiconductor chip may comprise a semiconductor layer stack consisting of a nitride compound semiconductor material on a carrier substrate. The carrier substrate may comprise a surface containing silicon and facing the semiconductor layer stack. The carrier substrate may be in particular a silicon substrate. The semiconductor layer stack may comprise an active layer generating radiation between a layer of a first conductivity type and a layer of a second conductivity type. The layer of the first conductivity type may be adjacent a front of the semiconductor layer stack. The semiconductor layer stack may contain at least one recess which extends from a back, opposite the front, of the semiconductor layer stack through the active layer to the layer of the first conductivity type. The layer of the first conductivity type electrically connects through the recess by a first electrical connection layer which covers the back of the semiconductor layer stack at least in places. The layer of the second conductivity type electrically connects by a second electrical connection layer arranged at the back.

"Based on a nitride compound semiconductor material" or "consisting of a nitride compound semiconductor material" means that the semiconductor layer sequence is a layer sequence deposited epitaxially on the substrate and comprising at least one layer of a nitride/III/V compound semiconductor material, preferably $Al_nGa_mIn_{1-m-n}N$, wherein $0 \leq n$, $m \leq 1$, $n+m \leq 1$. This material need not necessarily exhibit a mathematically exact composition according to the above formula. Instead, it may comprise one or more dopants and additional constituents which do not substantially modify the characteristic physical properties of the $Al_nGa_mIn_{1-m-n}N$ material. For simplicity's sake, however, the above formula includes only the fundamental constituents of the crystal lattice (Al, Ga, In, N), even if these may in part be replaced by small quantities of further substances.

The carrier substrate comprises, for example, a silicon surface facing the semiconductor layer stack. The carrier substrate may also take the form of a three-dimensional silicon substrate or of an SOI substrate ("silicon on insulator substrate"). The carrier substrate may contain further materials or material components in addition to silicon.

An optoelectronic semiconductor chip is in particular a semiconductor chip which allows the conversion of electronically generated data or energy into light emission or vice versa. The optoelectronic semiconductor chip is, for example, a radiation-emitting semiconductor chip.

The layer of the first conductivity type is, for example, an n-conductive layer. In this case, the layer of the second conductivity type is a p-conductive layer. Alternatively, the layer of the first conductivity type may also be a p-conductive layer and the layer of the second conductivity type may be an n-conductive layer.

The layer of the first conductivity type is adjacent a front, while the layer of the second conductivity type is adjacent a back of the semiconductor layer stack. The back is arranged opposite the front. The semiconductor chip is provided in particular for emission of electromagnetic radiation generated by the active layer from its front. The front accordingly corresponds to a radiation exit face.

The recess in the semiconductor layer stack preferably constitutes a well which extends from the back into the front. The recess conveniently extends through the layer of the second conductivity type and the active layer.

The first electrical connection layer in the recess is preferably insulated electrically by an electrical separation layer from the active layer and the layer of the second conductivity type. The electrical connection layer covers the back of the semiconductor layer stack preferably at least in places. The first electrical connection layer is, for example, a metallic layer, i.e., it comprises a metal or a plurality of metals or consists thereof. In particular, the first electrical connection layer supplies an electrical operating current to the semiconductor layer stack.

For further electrical contacting of the semiconductor layer stack, a second electrical connection layer is arranged at the back, which electrically contacts the layer of the second conductivity type. The first electrical connection layer and the second electrical connection layer are electrically insulated from one another in particular by the electrical separation layer. The electrical separation layer is arranged in particular in the vertical direction between first electrical connection layer and second electrical connection layer. The first electrical connection layer may in this case overlap the second electrical connection layer laterally at least in places at the back of the semiconductor layer stack.

The n- and p-doped layers of the semiconductor layer stack are thus unilaterally electrically contactable, i.e., for example, only from the back of the semiconductor layer stack. The light-emitting front of the semiconductor chip is accordingly free of electrical contact points such as, for example, bond pads. It is possible to reduce the risk of shading and/or absorption by the electrical contact points of some of the electromagnetic radiation emitted by the active layer when in operation.

The unilateral contact design of the chip allows low resistance contact. Due to arrangement of the contacts only on the back, the full functionality of the epitaxial layers of the semiconductor layer stack may advantageously be ensured, in particular the functional layers.

Silicon, for example, is used as the carrier substrate material and facilitates production of an inexpensive semiconductor chip. Large-area, inexpensive silicon substrates may in particular be used.

Overall, a semiconductor chip may be achieved which is distinguished by inexpensive production, wherein at the same time the functionality of the epitaxially grown functional layers of the semiconductor chip is retained completely or virtually completely due to unilateral contacting at the back.

The semiconductor chip may comprise a plurality of recesses through each of which the first electrical connection layer is guided. Electrical contacting of the layer of the first conductivity type is in this case allowed by the plurality of recesses.

The first and/or second electrical connection layers may comprise, for example, at least one of the following materials: Au, Ag, Al, Cr, Cu, Ti, Pt, Ni, Ru, NiAu.

The active layer of the semiconductor layer stack preferably contains a pn-junction, a double heterostructure, a single quantum well (SQW) or a multi quantum well (MQW) structure to generate radiation. The term quantum well structure does not here have any meaning with regard to the dimensionality of the quantization. It encompasses inter alia quantum troughs, quantum wires and quantum dots and any combination of these structures.

A plurality of nanostructures may be arranged in the semiconductor chip and/or on the front. Nanostructures are also known inter alia as "nanopyramids," "nanowires" or "nanorods,"

Nanostructures are, for example, three-dimensional structures, i.e., structures extending in three dimensions. For example, the nanostructures are rod-shaped.

The nanostructures may in this case be arranged on the front of the semiconductor layer stack. Alternatively or in addition, nanostructures may be arranged in the semiconductor layer stack such that at least one layer of the semiconductor layer stack may comprise the nanostructures. The semiconductor layer stack may, for example, be arranged with the active layer on the carrier substrate, wherein the nanostructures may be arranged between the carrier substrate and the active layer such that the active layer is in turn arranged between the nanostructures and the front. In this way, a reduction in defects in the active layer may advantageously be achieved, inter alia.

Advantageously, the use of nanostructures in conjunction with silicon substrates allows the growth of reduced-defect and thus high-quality nitride compound semiconductor material layers without the build-up of additional strains between substrate material and compound semiconductor material due to lattice mismatches. Such a combination may in particular lead to a reduction in strains due to the small base area of the nanostructures. Integral nanostructures combined with silicon carrier substrates thus lead advantageously to a reduction in defects in the semiconductor chip and to a reduction in strain.

The nanostructures may be grown in a self-organized manner. Alternatively, the nanostructures may be grown on prestructured carrier substrates, the diameter and the shape and distribution of the nanostructures on the carrier substrate being predetermined by a suitable lithographic process. If the parameters relating to diameter and distribution are suitably selected, it is possible additionally to achieve photonic effects by the nanostructures, the effects advantageously improving the achieved degree of outcoupling of light or electromagnetic radiation.

Nanostructures arranged in the semiconductor layer stack itself may advantageously serve as additional scattering centers for the radiation emitted by the active layer. The nanostructures may be arranged close to the active layer, wherein the diameter and distribution of the nanostructures may be configured such that they may result in increased efficiency of the radiation emitted by the semiconductor chip.

An interlayer may be arranged in the semiconductor layer stack and/or on the front. The interlayer is preferably arranged between a growth substrate and the active layer of the semiconductor layer stack. Use of such an interlayer allows the nitride layers of the semiconductor layer stack to be grown with compressive prestrain on a silicon growth substrate, which prevents the conventionally occurring mechanical damage to the epitaxial layers with layer thicknesses greater than 500 nm, preferably greater than 1800 nm. This advantageously makes it possible to produce a semiconductor layer stack on a silicon growth substrate with a thickness of over 500 nm, preferably over 1800 nm. In addition, such an interlayer may allow further defect reduction. This allows crack-free growth of the semiconductor layers on the silicon growth substrate.

The interlayer may be a layer sequence comprising AlN and/or AlGaN layers. In addition, the Ga content may be increased in the direction from the growth substrate towards the active layer, i.e., in the growth direction. Such an interlayer may advantageously improve surface morphology such that the layers of the semiconductor layer stack grown over the interlayer may be deposited with improved crystalline quality and homogeneity, thereby avoiding strains in the chip.

A conversion element may be arranged in the semiconductor layer stack and/or on the front, wherein the conversion element converts at least some of the radiation emitted by the active layer into radiation of another wavelength.

The conversion element preferably contains indium. The conversion element is preferably an InGaN layer. Such a layer may in particular find use as an optically pumped conversion element. The wavelength of the converted radiation is determined by the indium content in the conversion element. Such a conversion element offers the possibility of producing semiconductor chips which emit white radiation, for example, without additionally integrating phosphors into the semiconductor chip. Conversion elements consisting of indium have greater thermal stability than phosphor converters. In addition, such conversion elements are made from the same material as the semiconductor layer stack, thereby allowing conversion element and semiconductor layer stack to be joined together without an external boundary surface. As a result of the indium-containing conversion element, advantages are achieved compared to a phosphor-containing conversion element with regard to thermal stability, improved ageing resistance and greater out- or incoupling efficiencies.

The conversion element may be arranged in the nanostructures. In this case, the conversion element, in particular the InGaN layer, is thus integrated into the nanostructures. The wavelength of the converted radiation may here be determined by suitable selection of nanostructure diameter and the indium concentration in the InGaN. In particular, different diameters and spacings of the individual nanostructures may be used, thereby enabling broadband emission from the blue or near UV to red spectral range. In this way, a semiconductor chip may advantageously be achieved which emits white radiation. In addition, further effects may moreover be used to increase light via-arrangement of the nanostructures in the semiconductor layer stack or on the front.

The semiconductor chip may be a thin film chip. A semiconductor chip is regarded as a thin film chip if, during production thereof, the growth substrate on which the semiconductor layer stack was grown epitaxially, for example, has preferably been completely detached.

The semiconductor chip may be a radiation-emitting chip, in particular an LED, preferably a thin-film LED.

A method of producing an optoelectronic semiconductor chip with a semiconductor layer stack consisting of a nitride compound semiconductor material on a carrier substrate comprises the following steps:

provision of a growth substrate which comprises a surface containing silicon or which is a silicon substrate, epitaxial growth of the semiconductor layer stack on the silicon surface, which stack comprises an active layer that generates radiation between a layer of a first conductivity type and a layer of a second conductivity type, the layer of the first conductivity type being adjacent a front of the semiconductor layer stack, formation of at least one recess in the semiconductor layer stack, the recess extending from a back, opposite the front, of the semiconductor layer stack through the active layer to the layer of the first conductivity type, electrical connection of the layer of the first conductivity type through the recess by a first electrical connection layer which covers the back of the semiconductor layer stack at least in places, electrical connection of the layer of the second conductivity type by a second electrical connection layer arranged at the back, application of the carrier substrate to the opposite side of the semiconductor layer stack from the growth substrate, the carrier substrate comprising a silicon surface facing the semiconductor layer stack, and detachment of the growth substrate.

The features mentioned in relation to the optoelectronic semiconductor chip also apply for the method and vice versa.

As a result of use of the inexpensive silicon growth substrate and silicon carrier substrate, the method allows semiconductor chips to be produced inexpensively. Electrical contacting of the semiconductor chips is here configured and adapted to the epitaxy such that overall an improved inexpensive method and a semiconductor chip with improved properties may be achieved.

An interlayer may be introduced between growth substrate and active layer during the growth process. The interlayer is, for example, a layer sequence of AlN layers and $Al_xGa_{1-x}N$ layers. Use of these interlayers allows growth of nitride-based semiconductor layers with compressive prestrain on the silicon growth substrate, wherein damage to subsequent epitaxial layers with layer thicknesses of greater than 500 nm is prevented.

Use of an interlayer in combination with unilateral electrical contacting of the semiconductor chip allows an appropriate process chain and an advantageous, inexpensive production method.

A nucleation layer may be applied to the growth substrate prior to growth of the semiconductor layer stack. For growth on silicon growth substrates, specific nucleation processes are needed. These make it possible for the semiconductor layer stack to be grown on a large-area silicon growth substrate. In particular, they allow reduced-defect growth of semiconductor layers, wherein strain may be avoided or even reduced between the layers.

A plurality of nanostructures may be provided in the semiconductor layer stack and/or on the front. The use of nanostructures in the semiconductor layer stack, in combination with silicon growth substrates, allows the growth of reduced-defect and thus high-quality semiconductor layers without the build-up of additional strains or imperfections. Such a combination may advantageously lead to a reduction in strain. The nanostructures may in this case be formed within a layer of the semiconductor layer stack. This allows integrated scattering centers in the semiconductor layer stack, for example, close to the active layer, these advantageously leading to an increase in efficiency.

The nanostructures may be grown in a self-organized manner. Alternatively, the diameter and the distribution of the nanostructures on the growth substrate may be predetermined by a suitable lithographic method. If the diameter and distribution of the nanostructures are suitably selected, a photonic effect may advantageously be achieved, which may improve the outcoupling achieved.

A nucleation layer and an interlayer may be formed between growth substrate and active layer during the growth process, wherein nanostructures are additionally formed in the semiconductor layer stack or on the front. Such a combination may advantageously allow large-area, inexpensive, reduced-defect epitaxy and chip processing, wherein, by adapting the contacting-related structure of the chip to the epitaxy, an improved and inexpensive method is enabled overall.

A conversion element may be introduced into the nanostructures, wherein the conversion element is suited to converting at least some of the radiation emitted by the active layer into radiation of another wavelength. InGaN layers are preferably incorporated into the nanostructures, wherein the InGaN layers are used as conversion elements. The emitting color of the nanostructures may in this case be determined, for example, by suitably selecting the diameter of the nanostructures. Due to their small diameter, the nanostructures advantageously offer the possibility of efficiently incorporating a large quantity of indium into the nanostructures. The color of the converted radiation may in this case be influenced, for example, by suitable selection of the diameter of the nanostructures. This offers the possibility of producing white semiconductor chips without using additional phosphors. Compared to a phosphor-based conversion element, an indium-based conversion element has the advantage of increased thermal stability, improved ageing resistance and increased out- and incoupling efficiency. By way of the arrangement of the nanostructures in the semiconductor layer stack or on the front, further effects may additionally be used to increase light and/or to achieve directionality of the emitted radiation, for example, to emit radiation as a function of the solid angle. By suitably selecting the nanostructure diameters, broadband radiation emission from the blue or near UV spectral range to the red spectral range may additionally be achieved.

Further advantages and advantageous further developments are revealed by the examples described below in conjunction with FIGS. 1 to 5.

In the figures, identical or identically acting components may be provided with the same reference numerals. The elements illustrated and their size ratios to one another should not in principle be regarded as being to scale, but rather individual elements such as, for example, layers, structures, components and regions, may have been made exaggeratedly thick or large to illustrate them better and/or to make them easier to understand.

FIG. 1 shows a cross-section through an example of a semiconductor chip 10 in the process of being produced. The semiconductor chip 10 comprises a growth substrate 9 which comprises a silicon surface 9a. The individual layers of the semiconductor chip 10 are grown on the silicon surface 2a.

A specific growth or nucleation process is required for the growth of semiconductor layers onto the silicon growth substrate 9. Such a process offers the possibility of growing semiconductor layers onto large-area silicon substrates.

The growth or nucleation process for growth on silicon surfaces includes in particular growth of a nucleation layer 11 on the silicon surface 9a of the growth substrate 9. The nucleation layer 11 contains, for example, AlN, graduated AlGaN and GaN. Owing to the nucleation layer 11, semiconductor layers may be grown thereonto with a reduced level of defects. Since silicon is an inexpensive substrate material, an inexpensive semiconductor chip may thus be produced.

Nanostructures 6 are grown on the nucleation layer 11. The nanostructures 6 may be grown in a self-organized way. Alternatively and preferably, the nanostructures may be grown on the growth substrate 9, which is prestructured. In this case, the diameter and distribution of the nanostructures on the growth substrate 9 are predetermined by a lithographic process. The nanostructures 6 are preferably three-dimensional structures which take the form of rods, for example. Such nanostructures are also known as "nanowires" or "nanorods."

The use of nanostructures on silicon growth substrates advantageously allows the growth of reduced-defect, high-quality semiconductor layers without the build-up of additional strains in the semiconductor chip. Such nanostructures 6 may advantageously be used for additional strain reduction. This strain reduction proceeds due to the small base area of the nanostructures 6.

By using a combination of a nucleation layer 11 and nanostructures 6, it is possible to achieve large-area, inexpensive, reduced-defect epitaxy and semiconductor chip processing on silicon substrates. In this way, an improved method and a component with improved properties may be achieved.

A coalescent GaN layer 12 is arranged on the nanostructures 6. This coalescent GaN layer additionally serves in defect reduction such that the semiconductor chip is further improved.

An AlN layer or AlGaN layer 13 is optionally arranged on the coalescent GaN layer. The AlGaN layer may have a graduated aluminium concentration. This optional layer 13 improves the morphology of the coalescent GaN layer 12. In this way, the semiconductor layers to be applied to the AlN layer or AlGaN layer 13 may be deposited with improved crystalline quality and homogeneity.

A mask layer 14 is arranged on the optional layer 13. This mask layer 14 contains, for example, SiN and Al(Ga)N. Such a mask layer serves to reduce defects further.

An interlayer 7 comprising a plurality of individual layers is arranged on the mask layer 14. The interlayer 7 thus takes the form of a layer stack consisting of a plurality of individual layers. The interlayer 7 serves in particular to reduce strain in the semiconductor chip. The interlayer 7 is, for example, composed of AlN/Al$_x$Ga$_{1-x}$N layers. Use of this interlayer 7 allows growth of further semiconductor layers with compressive prestrain on the silicon growth substrate, so preventing damage during the growth process, for example, tearing of the epitaxial layers with layer thicknesses of greater than 500 nm.

Arranged on the interlayer 7 is the semiconductor layer stack 1 which contains a nitride compound semiconductor material. The semiconductor layer stack 1 comprises a layer 1b of a first conductivity type, an active layer 1a and a layer 1c of a second conductivity type. The active layer 1a is arranged in particular between the layer 1b of the first conductivity type and the layer 1c of the second conductivity type. The active layer 1a serves in radiation generation.

If, for example, layer 1b of the first conductivity type is an n-conductive layer, then layer 1c of the second conductivity type is a p-conductive layer, or vice versa. The layer 1b of the first conductivity type is an n-conductive GaN:Si layer. The layer 1c of the second conductivity type is a p-conductive GaN layer. The active layer 1a comprises a pn-junction or a quantum well structure, for example, a multi quantum well structure (MQW).

The example of FIG. 1 is in the process of being produced. Subsequent to the process of producing the chip 10 of the example of FIG. 1, a carrier substrate is applied opposite the growth substrate 9, the growth substrate 9 then being partially or completely detached. In addition, electrical contacting of the semiconductor layer stack 1 takes place.

Finished semiconductor chips 10 are shown in the examples of FIGS. 2 to 5.

Figure 2:
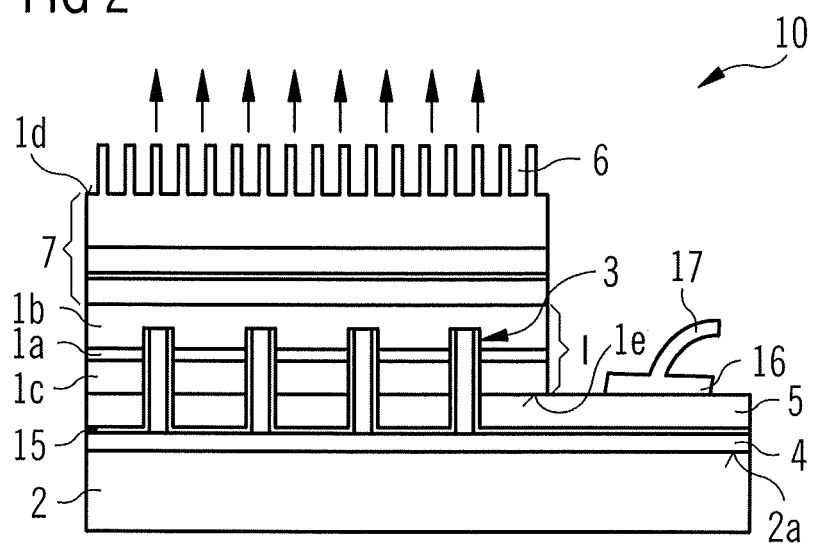
FIGS. 2 to 4, 5A and 5B each show schematic cross-sections of our semiconductor chips.

The semiconductor chip 10 shown in FIG. 2 comprises the electrically contacted semiconductor layer stack 1 on a carrier substrate 2. The carrier substrate 2 comprises at least one silicon surface 2a or is a solid silicon substrate. In particular, the carrier substrate 2 has the same coefficient of expansion as the growth substrate 9, whereby strains may be avoided in the semiconductor chip.

A first electrical connection layer 4 is arranged on the carrier substrate 2, in particular on the silicon surface 2a. This first electrical connection layer 4 contacts electrically the layer 1b of the first conductivity type. To avoid short-circuits, an electrically insulating separation layer 15 is arranged on the first connection layer 4. The electrically insulating separation layer 15 is arranged over the entire first electrical connection layer 4 apart from openings in the region of the layer 1b of the first conductivity type. In this way, the first connection layer 4 is fully insulated electrically by the separation layer 15 from the layer 1c of the second conductivity type. The first electrical connection layer 4 additionally comprises projections. These projections serve in electrical contacting of the layer 1b of the first conductivity type.

For electrical contacting of the semiconductor layer stack 1, recesses are introduced in particular in the semiconductor layer stack 1. The recesses extend from a back 1e of the semiconductor layer stack 1 through the active layer 1a to the layer 1b of the first conductivity type. The recesses are surrounded at the sides or laterally by the separation layer 15. In particular, the side faces of the recess 3 are completely enveloped by the separation layer 15. The projections of the first electrical connection layer 4 are introduced into the recesses 3. These are insulated electrically from the layer 1c of the second conductivity type and the active layer a by means of the separation layer 15.

A second electrical connection layer 5 is arranged between semiconductor layer stack 1 and electrically insulating separation layer 15. This second electrical connection layer 5 is likewise arranged at the back 1e of the semiconductor layer stack 1. The second electrical connection layer 5 electrically connects the layer 1c of the second conductivity type of the semiconductor layer stack 1. This second electrical connection layer 5 is insulated electrically from the first electrical connection layer 4 by the separation layer 15. At a lateral distance from the semiconductor layer stack 1, a contact surface 16 is arranged on the second electrical connection layer 5, which contact surface allows external electrical contacting of the semiconductor chip by a bonding wire 17.

The interlayer 7 is arranged on the semiconductor layer stack 1. The nanostructures 6 are additionally arranged on the interlayer 7. These were thus not detached in the process of detaching the growth substrate, but rather are located on a front 1d of the semiconductor chip 10.

The front 1d of the semiconductor chip 10 is in particular a radiation exit face for the radiation generated by the active layer. In particular, a major part of the radiation generated by the active layer 1a is coupled out of the semiconductor chip via the radiation exit face 1d.

The nanostructures 6 exhibit such a diameter and such a distribution that a photonic effect is achieved such that radiation outcoupling from the chip is improved. The nanostructures 6 accordingly constitute photonic crystals to increase efficiency. In addition, an additional effect of emitted radiation directionality may be achieved by the nanostructures 6 leading, for example, to purposeful radiation emission as a function of the solid angle.

The semiconductor chip 10 exhibits unilateral contacting on the p-side of the semiconductor layer stack 1. As a result of the combination of unilateral electrical contacting, the nucleation layer in the growth process and the interlayer for voltage reduction, it is possible to achieve large-area, inexpensive, reduced-defect epitaxy and chip processing, in which the structure of the semiconductor chip is adapted to the epitaxy process, resulting overall in an improved method and a component with improved properties. The unilateral electrical contacting of the chip in particular enables a low resistance n-contact with which at the same time the functionality of the grown functional layers of the chip is retained.

The semiconductor chip 10 is preferably a radiation-emitting semiconductor chip, in particular an LED, particularly preferably a thin-film LED.

Figure 3:
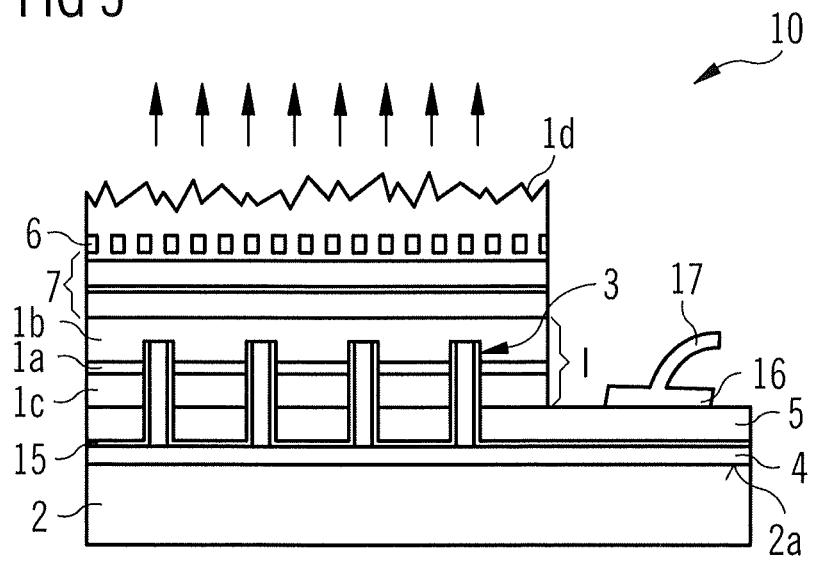

The example of FIG. 3 differs from the example of FIG. 2 in that the nanostructures 6 are arranged within a semiconductor layer of the semiconductor chip 10. These nanostructures buried in the semiconductor layer serve as scattering centers which advantageously lead to an increase in chip efficiency. In particular, the nanostructures 6 allow controlled incorporation and integration of scattering centers into the chip close to the active layer 1a, thereby allowing increased radiation efficiency.

The integrated nanostructures are arranged above the interlayer 7 in the example of FIG. 3. The nanostructures 6 are covered by a semiconductor layer material such that the nanostructures 6 are buried in the semiconductor material. The semiconductor material above the nanostructures 6 is configured such that photonic effects are produced for radiation outcoupling. For example, the surface of the semiconductor material at the front 1d of the semiconductor chip is roughened.

Otherwise, the example of FIG. 3 corresponds substantially to the example of FIG. 2.

Figure 4:
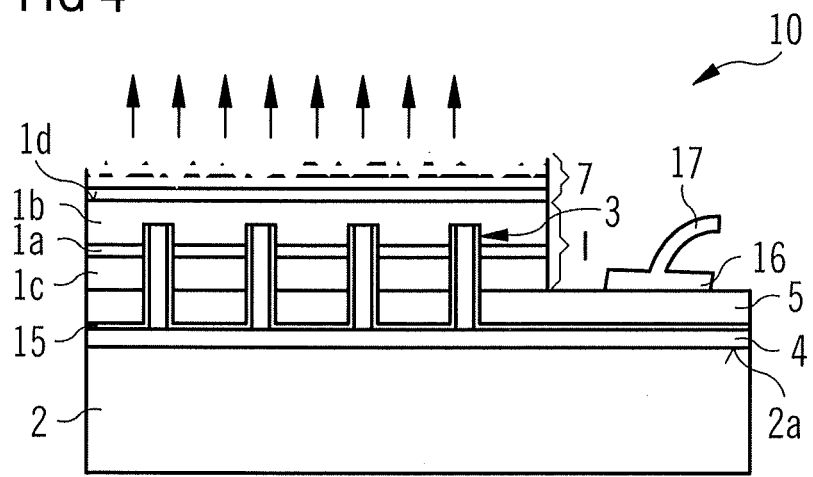

The example of the semiconductor chip 10 shown in FIG. 4 differs from the example of FIG. 2 in that the nanostructures 6 grown during the production process have been detached with the growth substrate. The interlayer 7 has likewise been detached at least in part during the production process. Only part of the interlayer 7, in particular an AlGaN layer, is present on the semiconductor layer stack 1. This serves as a radiation outcoupling structure such that radiation outcoupling is improved by this layer. The AlGaN layer may additionally be composed as a multiple layer which further improves outcoupling and thus efficiency.

The example of FIG. 4 otherwise substantially corresponds to the example of FIG. 1.

Figure 5A:
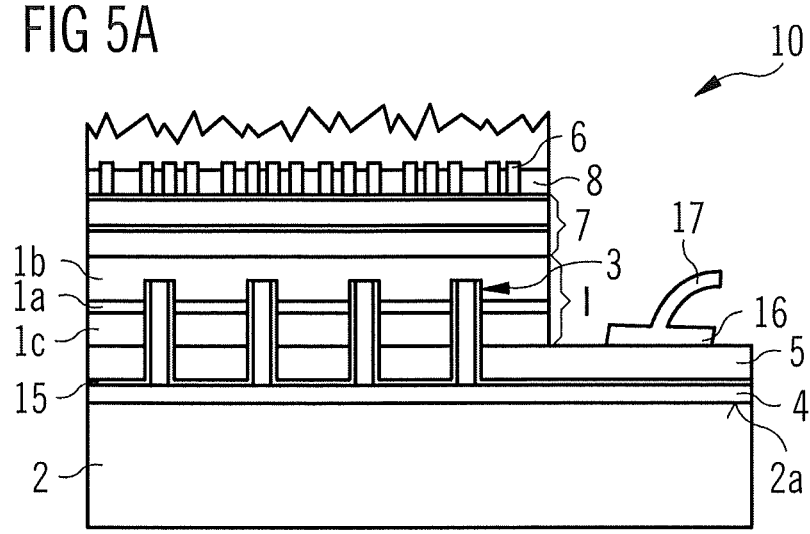
Figure 5B:
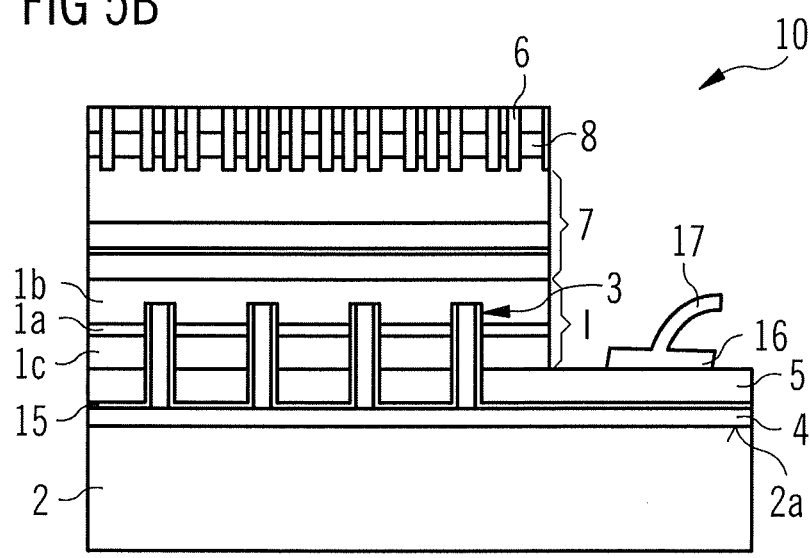

In FIGS. 5A and 5B, conversion elements 8 are additionally used. The conversion elements 8 are in particular integrated into the nanostructures 6. The conversion elements are in particular InGaN layers, wherein the degree of conversion or the color or wavelength of the converted light is measured by the indium content. The conversion element 8 is optically pumped when the chip is in operation, and not operated electrically.

The conversion element 8 converts some of the radiation emitted by the active layer 1a into radiation of another wavelength. In this way, the semiconductor chip 10 emits mixed radiation consisting of the radiation generated by the active layer 1a and the converted radiation, whereby an LED may, for example, be achieved which emits white color.

The emitting color of the chip may be determined inter alia by the diameters selected of the nanostructures. In particular, the nanostructures offer the possibility, due to their diameter, of efficiently incorporating a high quantity of indium into the chip. This offers the possibility of producing white LEDs without the need for additional phosphors. Conversion elements consisting of InGaN have the advantage over conversion elements of phosphor of increased thermal stability, improved ageing resistance and greater out- and incoupling efficiency. Through suitable selection of the nanostructure diameters, it is additionally possible to achieve broadband emission from the blue or near UV to red spectral range, for example, if the nanostructures are arranged in an array and have different diameters.

Through the arrangement of the nanostructures, it is additionally possible to exploit further light-increasing effects such as, for example, Purcell effects.

In the example of FIG. 5A, a semiconductor chip 10 according to the example of FIG. 3 is shown, wherein unlike in the example of FIG. 3 the above-described conversion elements 8 are integrated into the nanostructures 6.

The example of FIG. 5B corresponds to the example of FIG. 2 with additionally integrated conversion elements 8.

The description made with reference to examples does not restrict the invention our chips and methods to these examples. Rather, this disclosure encompasses any novel feature and any combination of features, including in particular any combination of features in the appended claims, even if the feature or combination is not itself explicitly indicated in the claims or examples.

The invention claimed is:

1. An optoelectronic semiconductor chip comprising a semiconductor layer stack consisting of a nitride compound semiconductor material on a carrier substrate, wherein
   the carrier substrate comprises a surface containing silicon and facing the semiconductor layer stack,
   the semiconductor layer stack comprises an active layer that generates radiation arranged between a layer of a first conductivity type and a layer of a second conductivity type,
   the layer of the first conductivity type is adjacent a front of the semiconductor layer stack,
   the semiconductor layer stack contains at least one recess extending from a back, opposite the front, of the semiconductor layer stack through the active layer to the layer of the first conductivity type,
   the layer of the first conductivity type electrically connects to a first electrical connection layer, which covers the back of the semiconductor layer stack at least in places, through the recess, and
   the layer of the second conductivity type electrically connects to a second electrical connection layer arranged at the back,
   a plurality of nanostructures is arranged on the front,
   the nano structures are formed rod-like or are nanopyramids, nanowires or nanorods,
   a conversion element is arranged on the front which converts at least some of the radiation emitted by the active layer into radiation of another wavelength, and
   the conversion element is an InGaN layer arranged and integrated into the nanostructures.

2. The semiconductor chip according to claim 1, wherein an interlayer is arranged in the semiconductor layer stack and/or on the front.

3. The semiconductor chip according to claim 1, wherein the wavelength of the converted radiation is determined at least in part by diameters and/or distribution of the nanostructures.

4. The semiconductor chip according to claim 1, wherein the semiconductor chip is a thin film chip.

5. The semiconductor chip according to claim 1, wherein the semiconductor chip is an LED.

* * * * *

UNITED STATES PATENT AND TRADEMARK OFFICE
CERTIFICATE OF CORRECTION

| | |
|---|---|
| PATENT NO. | : 8,823,034 B2 |
| APPLICATION NO. | : 13/825842 |
| DATED | : September 2, 2014 |
| INVENTOR(S) | : Bergbauer et al. |

It is certified that error appears in the above-identified patent and that said Letters Patent is hereby corrected as shown below:

On the Title Page, at Item (54), and in the Specification, Column 1

Please change "OPTOELECTRIC" to -- OPTOELECTRONIC --.

Signed and Sealed this
Sixth Day of January, 2015

Michelle K. Lee
*Deputy Director of the United States Patent and Trademark Office*